US006189126B1

(12) United States Patent
Ulmer et al.

(10) Patent No.: US 6,189,126 B1
(45) Date of Patent: Feb. 13, 2001

(54) EFFICIENT TRELLIS STATE METRIC NORMALIZATION

(75) Inventors: Elisha J. Ulmer, Tiberias; Jeremy M. Stein, Haifa, both of (IL)

(73) Assignee: Qualcomm Incorporated, San Diego, CA (US)

( * ) Notice: Under 35 U.S.C. 154(b), the term of this patent shall be extended for 0 days.

(21) Appl. No.: 09/186,753

(22) Filed: Nov. 5, 1998

(51) Int. Cl.$^7$ .......................... H03M 13/39; H03M 13/41
(52) U.S. Cl. .............................. 714/795; 714/794
(58) Field of Search ................... 714/794, 795

(56) References Cited

U.S. PATENT DOCUMENTS

| 5,295,142 | * | 3/1994 | Hatakeyama | 371/43 |
| 5,349,608 | * | 9/1994 | Graham et al. | 375/94 |
| 5,418,795 | | 5/1995 | Itakura et al. | 371/30 |

FOREIGN PATENT DOCUMENTS

| 1962607 | 1/1997 | (DE) . |
| 6204897 | 7/1994 | (JP) . |

OTHER PUBLICATIONS

1989 IEEE Transactions on Communications, vol. 37, No. 11, "An Alternative to Metric Rescaling in Viterbi Decoders", A. Hekstra, pp. 1220–1222.

1998 International Journal of Satellite Communications, vol. 16, "Implementation and Performance of a Turbo/MAP Decoder", S. Pietrobon, pp. 23–46.

1998 IEEE Journal on Selected Areas of Communications, vol. 16, No. 2, "An Intuitive Justification and a Simplified Implementation of the MAP Decoder for Convolutional Codes", A Viterbi, pp. 260–264.

Shung, et al. VLSI Architectures for Metric Normalization in the Viterbi Algorithm IEEE pp. 1723–1728 (1990).

\* cited by examiner

Primary Examiner—Stephen M. Baker
(74) Attorney, Agent, or Firm—Philip R. Wadsworth; Thomas R. Rouse (57) ABSTRACT

A method and apparatus for normalizing a plurality of state-metric registers in a decoder using a trellis. The method includes determining an approximate minimum of respective state-metric values stored in the plurality of state-metric registers, and subtracting the approximate minimum from the values. Determining the approximate minimum preferably includes determining the minimum of a predetermined number of most significant bits in the plurality of state-metric registers.

18 Claims, 7 Drawing Sheets

FIG. 1
*Encoder for generator*
$G[D] = [1, (1 + D + D^2)/(1 + D)]$

*Prior Art*

EFFICIENT TRELLIS STATE METRIC NORMALIZATION

FIELD OF THE INVENTION

The present invention relates generally to decoding methods, and specifically to fast decoding of codes using a trellis.

BACKGROUND OF THE INVENTION

Transmission of digital data is inherently prone to interference which may introduce errors into the transmitted data. Error detection schemes have been suggested to determine as reliably as possible whether errors have been introduced into the transmitted data.

When the transmitted data is not used on-line, it is possible to request re-transmission of erroneous data when errors are detected. However, when the transmission is performed on-line, such as in telephone lines, cellular phones, remote video systems, etc., it may not be possible or practical to request re-transmission.

Convolution codes, and other similar codes, have been introduced to allow receivers of digital data to correctly determine the transmitted data even when errors may have occurred during transmission. The convolution codes introduce redundancy into the transmitted data by representing each input bit of data by more than one coded bit in the transmitted data. Usually, the coded bits of the transmitted data are packed into packets in which the value of each coded bit is dependent on earlier bits in the sequence. Thus, when a few errors occur, the receiver can still deduce the original data by tracing back possible sequences in the received data.

In some decoders, rather than determining immediately whether received signals originating from a single transmitted, coded bit are zero or one, the receiver assigns each of the signals a word which has a value on a multi-level scale representative of the probability that the coded bit is one. An exemplary scale, referred to as LLR probabilities, represents each transmitted coded bit by a 6-bit word, representing an integer in the range $\{-32,31\}$. If words of a different number of bits are used, the range is adjusted accordingly. The LLR probability of a coded bit is calculated by taking the logarithm of the ratio of the probability that the bit is one to the probability that the bit is zero, or the logarithm of the reciprocal of the ratio. The value of 31 signifies that the transmitted bit was a zero with very high probability, and the value of $-32$ signifies that the transmitted bit was a one with very high probability. A value of zero indicates that the value is indeterminate.

When a transmitter transmits a coded packet of bits, in which each coded bit has a definite value of "1" or "0", over a noisy channel, the receiver receives a packet in which each bit has a variable voltage value, which may be interpreted as a LLR probability, due to interference introduced by the channel. A decoder must determine the transmitted packet based on the received packet. A simple method involves determining a "difference" between the received packet and all possible packets and determining which possible packet has the smallest difference. However, due to the large number of different possible values of the packets, this method is usually impractical.

In convolution coding methods, and in other related methods, an uncoded input packet is fed into an encoder which has a number of possible states. As each data bit of the uncoded packet is fed into the encoder, it causes a change in the state of the encoder and provides a group of one or more output coded bits which are a function of the state and the input. The groups of output coded bits form a coded packet which is transmitted. The number of bits in each group is a factor of redundancy introduced by the code as a result of the convolution. A code in which each group, for example, includes two bits has a code rate of 1/2, meaning that the actual information content of a packet is equal to half the number of coded bits in the packet.

Convolutional codes are generally decoded in accordance with decoding schemes which use a trellis, such as MAP decoding (or APP decoding), SOVA decoding and Viterbi decoding. A decoder receives the words representing the probabilities of the received coded bits in the coded packet (together with noise introduced during transmission) and decodes the coded packet by retracing the steps of the encoder. The decoder calculates for each possible state of the encoder a difference between the words representing the received packet and a preferred transmitted packet, which would have brought the encoder to that state. This difference is referred to as a state metric. For each group of words representing a group of received bits, the decoder updates the state metric of each possible state according to the difference between the probability values of the received bits and the ideal hypothetical values that would have been required for a specific state transition (referred to as a trellis transition) of the encoder. In Viterbi decoding, when transitions from different states lead to the same resultant state, the transition resulting in a state metric with the highest probability prevails. In MAP and APP decoding, the value of the new state metric is a function of all the transitions leading into the state, for example, a sum thereof.

The state metric rapidly increases with each bit that is processed, and with packets of thousands of bits may require representation in 15–20 bits or even more. When the decoding is performed in software by, for example, a digital signal processor, such sizes do not in themselves cause much of a problem. However, since the decoding must be performed under critical time constraints, dedicated hardware processors are preferably used. In such processors, it is necessary to limit the number of bits used to represent the state metric, in order to achieve fast decoding without excessive hardware cost.

A common solution involves using 8 bit registers to store the state metrics. In order to prevent saturation, a normalization metric (NM) comprising the minimal state metric is calculated periodically, preferably after each successive trellis transition, and the NM is subtracted from all the registers. However, calculation of the minimal state metric is time-consuming. Generally, the NM is calculated in parallel with the operation of the decoder, and the NM is subtracted at a later, delayed stage when the minimum is determined. In the meanwhile, the registers may saturate, losing valuable data. In addition, such a solution requires additional hardware for saving the NM to be used at the later stage, and for subtracting from the NM at the later stage previous values of the NM already subtracted from the state metric registers during the delay.

A. P. Hekstra, in "An Alternative to Metric Rescaling in Viterbi Decoders," IEEE Trans. Commun. Vol. 37, No. 11 (November 1989), pp. 1220–1222, which is incorporated herein by reference, suggests using a modular calculation method to prevent saturation of the state metrics. In order to prevent saturation, a few additional bits are used to represent the state metric together with the modular calculation result. For example, for a four-state, 1/2 rate code with 6-bit data words, 11-bit registers as used to store the state metrics.

However, every additional bit in the registers requires more calculation time and raises the cost of the decoder.

SUMMARY OF THE INVENTION

It is an object of some aspects of the present invention to provide methods and apparatus for fast state normalization in decoders using a trellis.

It is another object of some aspects of the present invention to provide apparatus for state normalization which is less prone to saturation than apparatus known in the art.

In preferred embodiments of the present invention, a decoder using a trellis, such as an A Posteriori Probability (APP) (or a Maximal A Posteriori (MAP)) decoder, a Viterbi decoder or a soft-output Viterbi algorithm (SOVA) decoder, calculates a minimum state metric used in normalization only approximately. The damage from the approximate calculation is negligible, relative to the savings in time due to the approximation. Preferably, the approximate minimum is less than or equal to the actual minimum, so that when the calculated minimum is subtracted from all the state metric registers, using unsigned arithmetic, no data is lost.

Preferably, the approximate minimum is calculated by determining the minimum of a few most significant bits of the state metrics. Preferably, the number of bits used to calculate the approximate minimum is between 30% and 60% of the bits in the state metrics. In a preferred embodiment of the present invention, there are eight bits in the state metric registers, and the four most significant bits (MSBs) are used in calculating the minimum for normalization.

There is therefore provided in accordance with a preferred embodiment of the present invention, a method of normalizing a plurality of state-metric registers in a decoder using a trellis, including determining an approximate minimum of respective state-metric values stored in the plurality of state-metric registers, and subtracting the approximate minimum from the values.

Preferably, the approximate minimum is always equal to or less than an actual minimum of the values in the plurality of state-metric registers.

Preferably, determining the approximate minimum includes determining the minimum of a predetermined number of most significant bits in the plurality of state-metric registers.

Preferably, the predetermined number of most significant bits includes between 30% and 60% of the number of bits in the register.

Preferably, the method includes calculating new state-metric values for the registers and wherein subtracting the approximate minimum is performed substantially concurrently with calculating the new values.

Preferably, the method includes storing in the state metric registers during a plurality of consecutive clock cycles a plurality of respective new values, wherein determining the approximate minimum includes determining an approximate minimum of the new values in substantially every cycle.

Preferably, determining the approximate minimum includes determining an approximate minimum during a first one of the plurality of clock cycles, and wherein subtracting the approximate minimum includes subtracting during a second one of the plurality of clock cycles after the first one.

Preferably, the method includes adjusting the approximate minimum responsive to a time gap between the first and second clock cycles.

Preferably, adjusting the approximate minimum includes subtracting from the approximate minimum calculated during the second cycle the approximate minimum calculated during the first cycle.

There is further provided in accordance with a preferred embodiment of the present invention, a state-metric calculation unit for use in a decoder which decodes using a trellis, including a plurality of state-metric registers, which store respective state-metric values, a minimum calculation unit, which determines an approximate minimum of the plurality of registers, and a plurality of subtractors, which subtract the approximate minimum from the values in the plurality of registers.

Preferably, the minimum calculation unit calculates the minimum of a predetermined number of most significant bits in the registers, and the subtractor subtracts the approximate minimum from the predetermined number of most significant bits of the registers.

Preferably, the unit includes a plurality of recursive combiners which calculate for each register a next state-metric of the register and wherein each recursive combiner includes a respective one of the subtractors.

Preferably, the decoder is a Viterbi decoder, an APP decoder, a MAP decoder, a Trellis decoder and/or a Soft Output Viterbi decoder.

There is further provided in accordance with a preferred embodiment of the present invention, an iterative decoding processor for iterative decoding of a sequence of signal packets coded in accordance with a multi-component coding scheme, including a plurality of calculation units as described above.

The present invention will be more fully understood from the following detailed description of the preferred embodiments thereof, taken together with the drawings, in which:

DETAILED DESCRIPTION OF PREFERRED EMBODIMENTS

Figure 1:
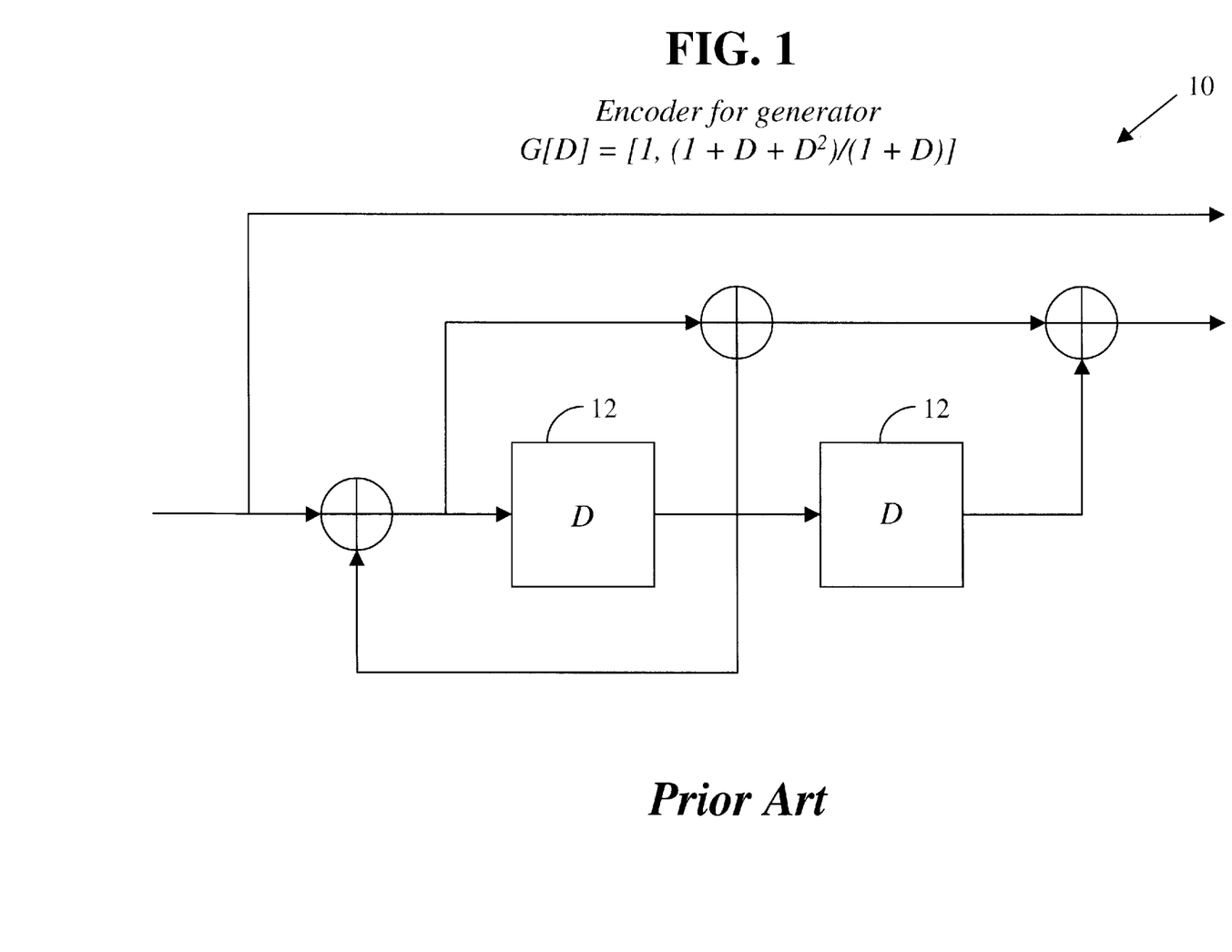
FIG. 1 is a schematic block diagram of an encoder 10 which generates encoded packets.

FIG. 1 is a schematic block diagram of an encoder 10 which generates encoded packets. The code generated by encoder 10 has a generator matrix (G[D]) given by equation (1):

$$G[D]=[1,(1+D+D^2)/(1+D)] \quad (1)$$

wherein D represents a delay element 12.

Figure 2:
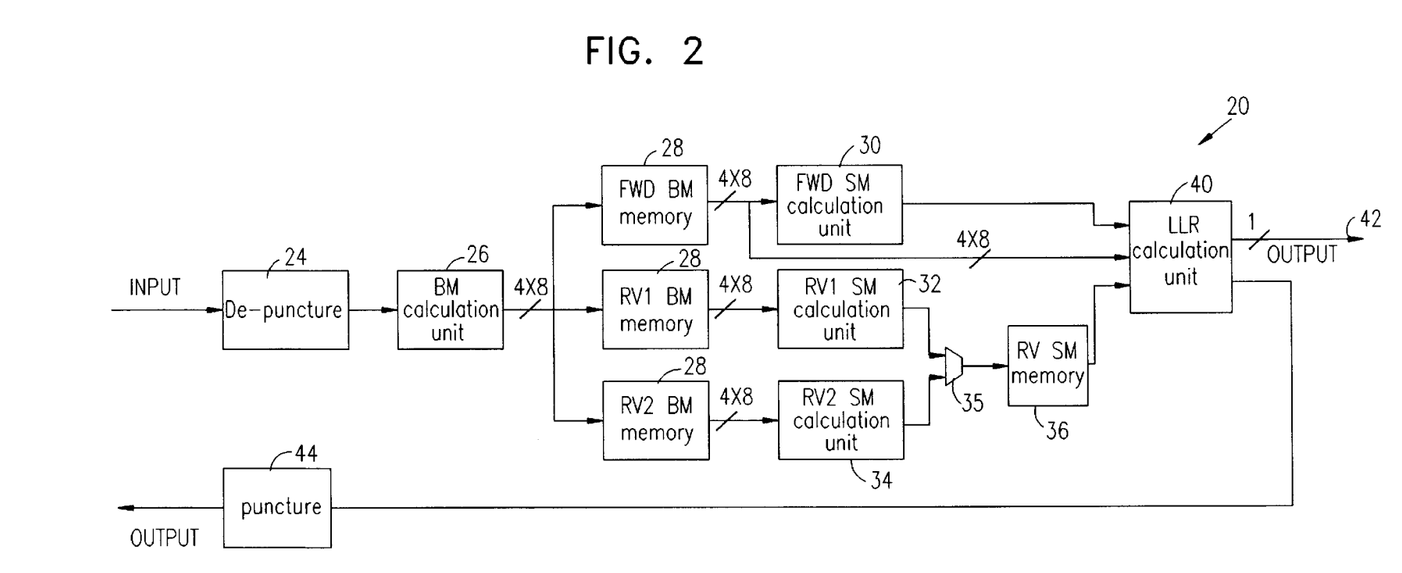
FIG. 2 is a schematic block diagram of an APP decoder, in accordance with a preferred embodiment of the present invention.

FIG. 2 is a schematic block diagram of an APP decoder 20, in accordance with a preferred embodiment of the present invention. Decoder 20 uses a trellis to decode the code generated by encoder 10.

Decoder 20 comprises a single input line through which an input packet is provided to the decoder. An optional de-puncturer 24 adds LLR probability words with null or zero values, as required, if the code decoded by decoder 20 involved puncturing, as is known in the art. The null or zero values indicate that the code bits represented by the LLR words have equal probability of being "1" or "0". For each group of LLR words in the input packet, a branch metric (BM) calculation unit 26 calculates, as is known in the art, a BM for each possible hypothetical value of the code bits represented by the LLR words in the group. For 1/2 rate codes, such as the code generated by encoder 10, each group corresponds to two coded bits and therefore has four possible hypothetical values.

Preferably, as described further hereinbelow, unit 26 outputs four 8-bit BMs for each new group of LLR words in the input. Each BM is indicative of the probability that the group of bits originally had the corresponding hypothetical value. BM unit 26 may be, for example, as described in "Implementation and Performance of a Turbo/MAP Decoder," by Steven S. Pietrobon, in the International Journal of Satellite Communications, Vol. 16 (1998), pp. 23–46, which is incorporated herein by reference.

One or more, preferably three, state-metric (SM) calculation units 30, 32 and 34 receive the BMs and accordingly calculate the state-metrics of each of the states of the code, as described further hereinbelow. Preferably, SM calculation units 30, 32 and 34 receive the BMs from one or more memory units 28 where the branch-metrics are stored. Further preferably, each SM calculation unit has its own BM memory unit 28 so that the SM calculation units can operate in parallel without interfering with each other. Preferably, SM units 30, 32 and 34 differ in the direction in which the packet is processed. Unit 30 processes the packet in a first (forward) direction, from beginning to end, while units 32 and 34 process the packet in the opposite (reverse) direction, from end to beginning.

Two reverse units 32 and 34 are preferably used in order to allow use of an approximation method based on reversing segments of the input packet instead of reversing the entire packet. This approximation allows performing the reverse decoding directly after each data segment in the packet is received, rather than waiting for an entire packet to be reversed. The method is described in "An Intuitive Justification and a Simplified Implementation of the MAP Decoder for Convolutional Codes," by Andrew J. Viterbi, IEEE Journal on Selected Areas in Communications, Vol. 16, No. 2, pp. 260–264 (February, 1998), which is incorporated herein by reference. Each of units 32 and 34 provides reliable SMs during half the operation time, so that together they supply reliable SMs for the entire packet. A multiplexer 35 selects the proper results in accordance with the approximation method. A memory unit 36 is used to reverse the order of the processed packet, or segments, back to the proper forward order, so that it may be used together with the results from unit 30.

An LLR calculation unit 40 calculates an output probability value for each LLR word, based on the SMs from units 30, 32 and 34 and on the BMs from unit 26. LLR unit 40 is preferably as described in the above-mentioned article by Steven S. Pietrobon or alternatively as described in the above mentioned article by Andrew J. Viterbi. The result from unit 40 may be output to an output line 42 and/or may be passed through a puncturer 44 for further processing.

Figure 3:
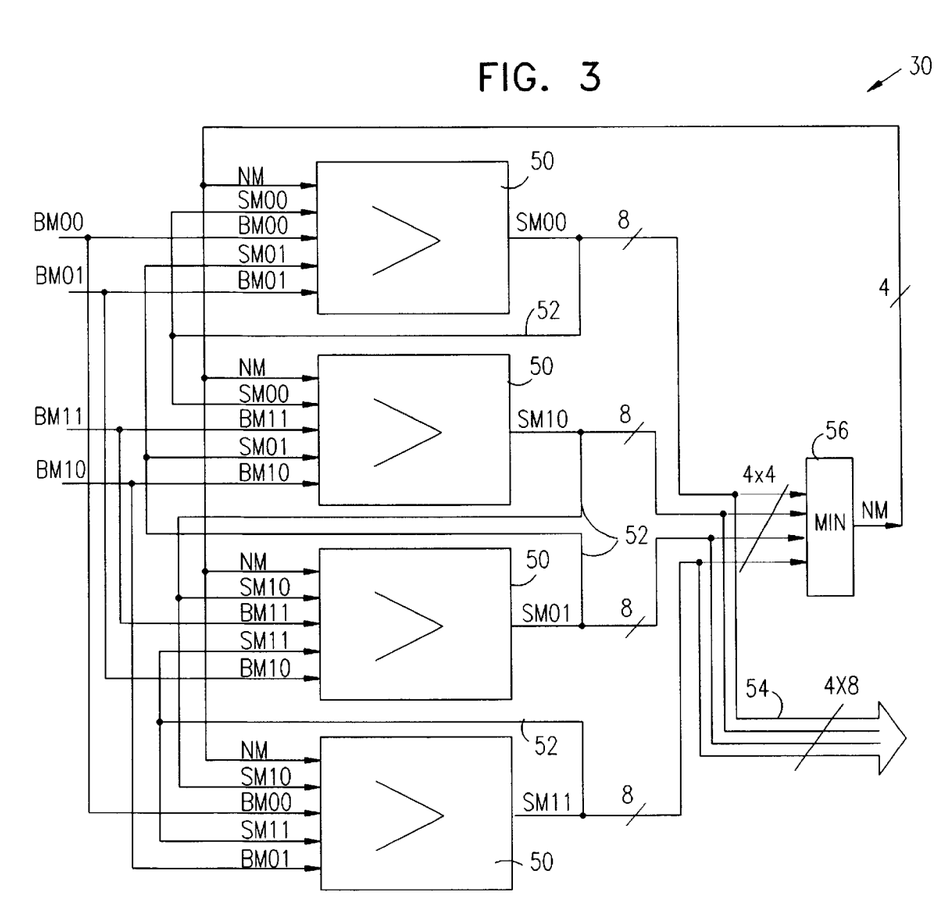
FIG. 3 is a schematic block diagram of a forward state-metric calculation unit in the decoder of FIG. 2, in accordance with a preferred embodiment of the present invention.

FIG. 3 is a schematic block diagram of forward SM calculation unit 30, in accordance with a preferred embodiment of the present invention. Reverse SM units 32 and 34 are similar in structure with unit 30, with necessary modifications as are known in the art. Unit 30 comprises four recursive metric combiners 50, corresponding to each of four possible states of the encoder. Each of combiners 50 recursively calculates the SM of the state. For each bit-group (n+1) in the packet, combiners 50 update their SMs based on the SMs of the previous bit-group (n) and on the corresponding BMs, as described hereinbelow. The calculated SMs are passed back on feedback lines 52 for the next calculation iteration of the next bit-group of the packet. Preferably, a plurality of output lines 54 provide the SMs to LLR calculation unit 40. In addition, a minimum calculation unit 56 determines, after every one or more recursive iterations of combiners 50, the minimum of the most significant bits of the SMs. The calculated minimum is used as a normalization-metric (NM) and is passed back to combiners 50 for normalization.

Figure 4:
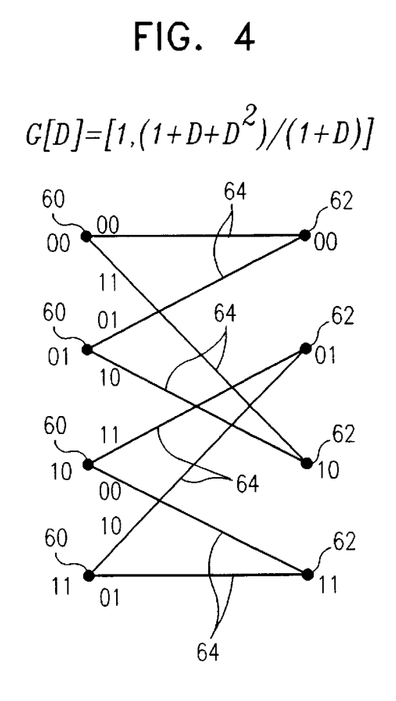
FIG. 4 is a graph of possible state transitions in the encoder of FIG. 1.

It is noted that in preferred embodiments of the present invention, unit 30 includes more than four combiners 50, preferably 16 combiners corresponding to 16 states. However, for the sake of clarity, FIGS. 2–4 illustrate a simpler four-state embodiment. Extension of the concepts described herein to operate with 16 or even greater numbers of states will be straightforward for those skilled in the art.

FIG. 4 is a graph showing the possible state transitions in the code decoded by decoder 20, wherein the code is generated in accordance with Eq. (1), above. Nodes 60 represent the possible states of the encoder for a bit-group (n) of two bits. Nodes 62 represent the possible states of the encoder for a subsequent bit-group (n+1). In accordance with the code, the encoder may make a transition from one of nodes 60 of bit-group (n) to certain ones of nodes 62 of bit-group (n+1) only along one of a plurality of branches 64. To make such transition, bit-group (n) must have the value indicated above the corresponding branch 64.

Therefore, returning to FIG. 3, each combiner 50 receives two SMs, which are the SMs of those nodes 60 which may lead to the state associated with the particular combiner, represented by node 62 of the combiner 50. In addition, each combiner 50 receives two BMs which correspond to the BMs of the branches 64 which lead from the two nodes 60 to the node 62 corresponding to the particular combiner. For example, the upper combiner 50 in FIG. 2 corresponds to state '00'. It therefore receives the SM of state '00' and the BM '00' which is the bit-group of the branch 64 which leads from node 60 of state '00' to node 62 of state '00'. In addition, the upper combiner 50 receives the SM of state '01' and the BM '01' which is the bit-group of the branch 64 which leads from node 60 of state '01' to node 62 of state '00'.

Figure 5:
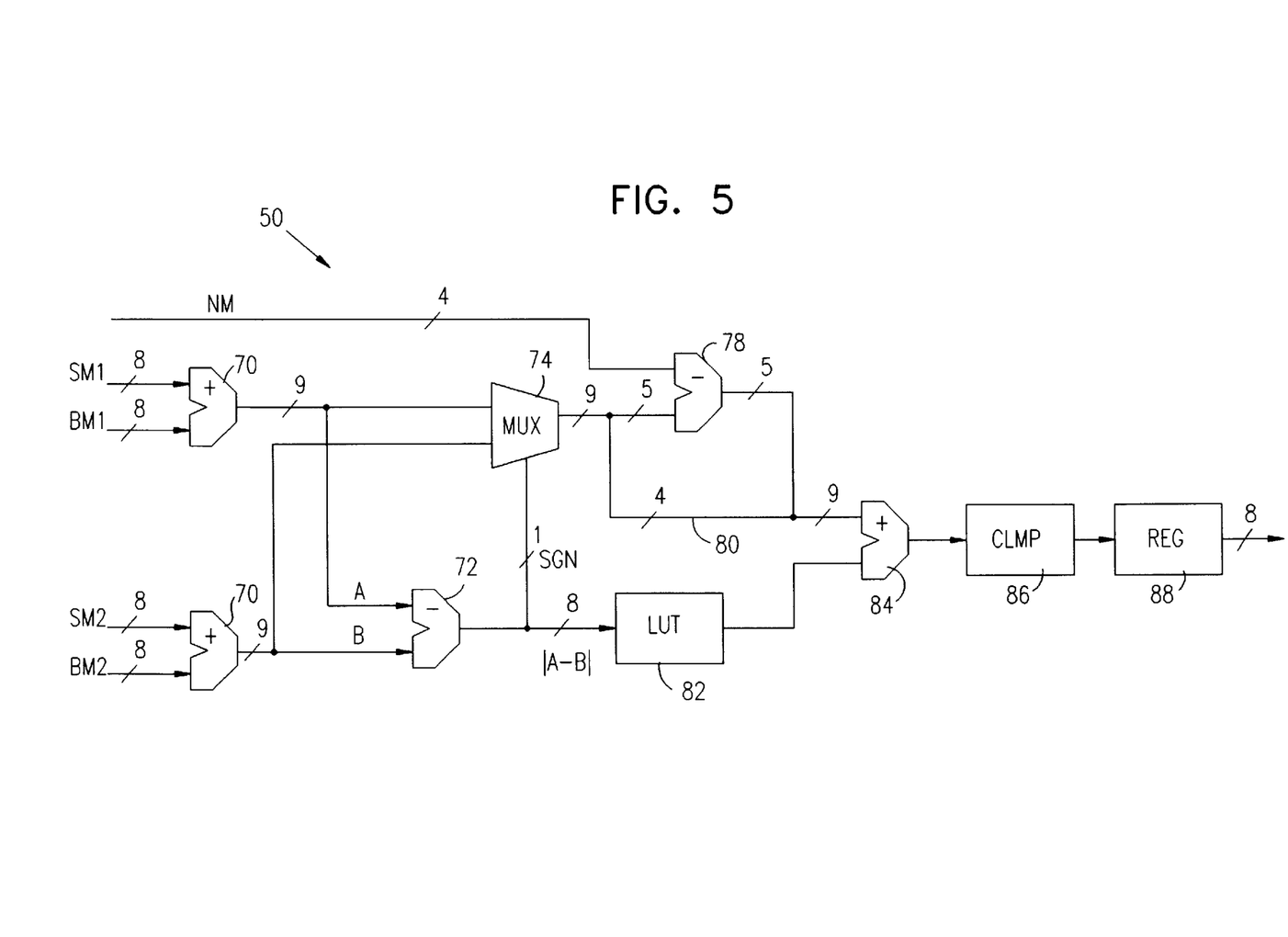
FIG. 5 is a block diagram of a recursive metric combiner in the state-metric calculation unit of FIG. 3, in accordance with a preferred embodiment of the present invention.

FIG. 5 is a schematic block diagram of recursive combiner 50, in accordance with a preferred embodiment of the present invention. Two adders 70 calculate respectively the two possible next-stage (n+1) state-metrics of the state represented by the specific combiner 50, by adding the SM of the proper nodes 60 to respective BMs of the corresponding branches 64. A subtractor 72 subtracts the two possible next-stage state-metrics from one another, and based on the sign from the subtraction, the lower state-metric is chosen by a MUX 74. The state metric from MUX 74 is preferably nine bits wide. The normalization metric (NM) calculated in unit 56 is subtracted from the five most significant bits of the chosen SM in a subtractor 78. The four least significant bits of the state-metric are preferably passed intact on a line 80 bypassing subtractor 78.

Preferably, a look-up table 82 determines an offset based on the difference between the two possible next-stage state-metrics (a, b) calculated by subtractor 72. Preferably, the output of look-up table 82 is as described in equation (2):

$$\text{LUT}=\text{Const}*(\ln 2-\ln(1+e^{-|a-b|})) \quad (2)$$

in which Const is a scaling variable dependent on the number of bits representing the SMs, or more precisely, on the quantization step of the SMs. Equation (2) is known in the art for APP decoders. It is noted that Viterbi decoders also include a combiner similar to combiner 50, but without LUT 82.

The offset is added to the normalized state-metric at an adder 84, providing a corrected state-metric. Preferably, the corrected state-metric is saturated to eight bits at a clamp 86 and is then stored in an eight-bit register 88 for output from recursive combiner 50.

Figure 6:
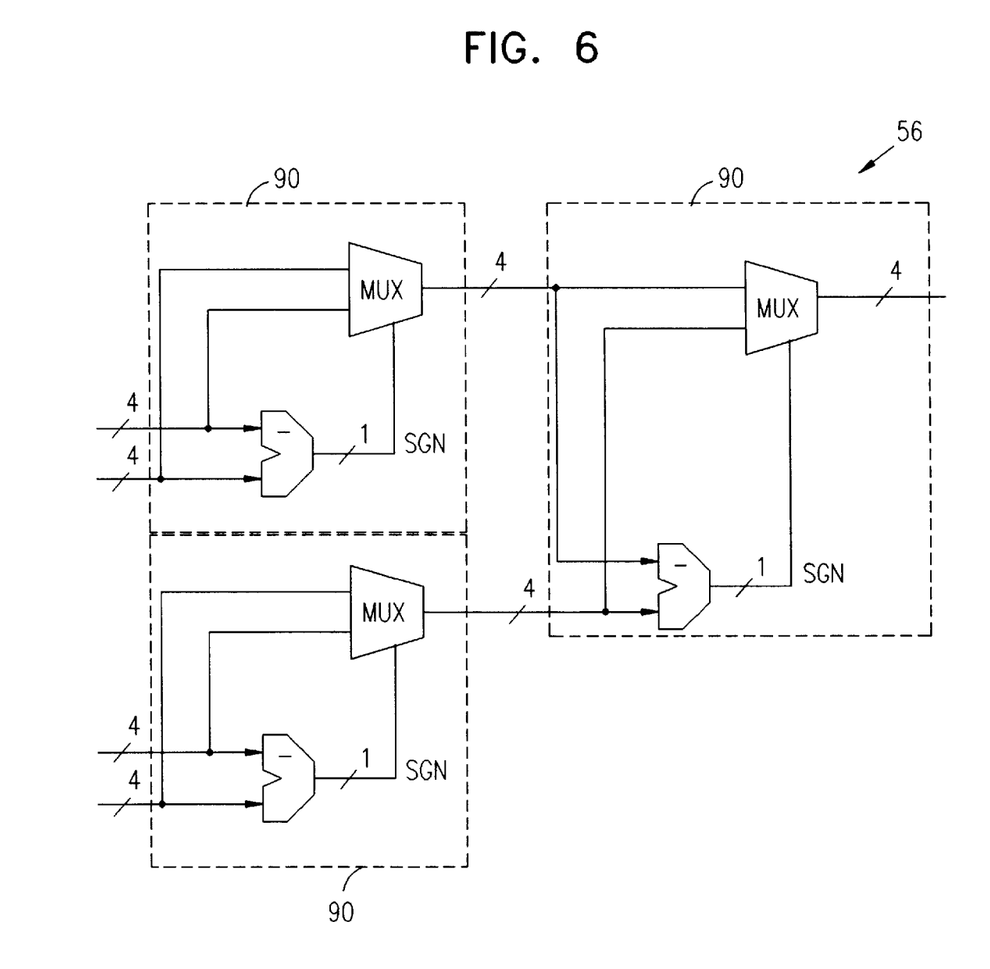
FIG. 6 is a block diagram of a minimum calculation unit in the state-metric calculation unit of FIG. 3, in accordance with a preferred embodiment of the present invention.

FIG. 6 is a block diagram of minimum calculation unit 56, in accordance with a preferred embodiment of the present invention. Unit 56 preferably receives the four most significant bits (MSB) of the SMs from each of recursive combiners 50. Selecting units 90 select the four MSB that have the lowest value, which is output as the normalization metric (NM).

Figure 7:
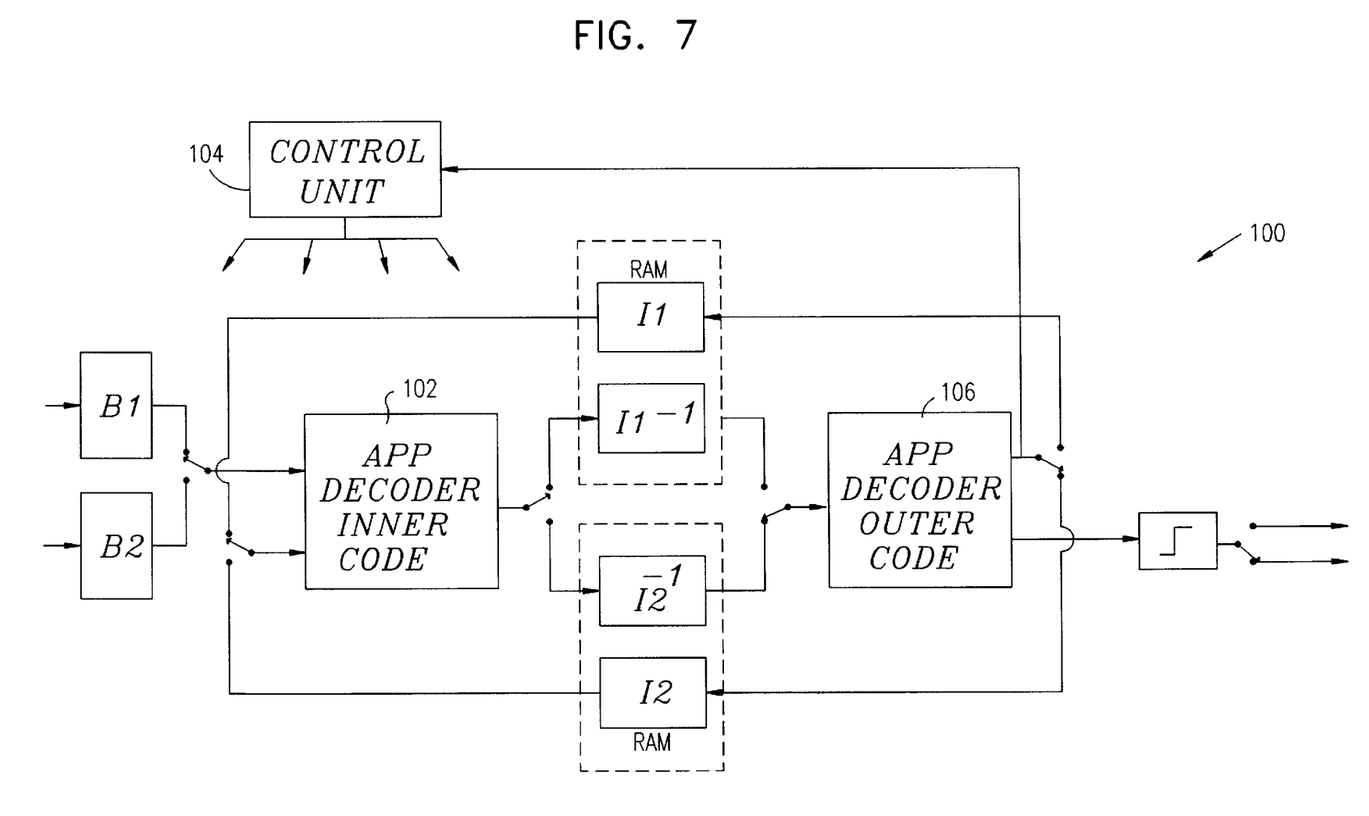
FIG. 7 is a block diagram of a decoding processor which includes two decoders similar to the decoder of FIG. 2, in accordance with a preferred embodiment of the present invention.

FIG. 7 is a block diagram of a decoding processor 100 which uses two decoders similar to decoder 20, in accordance with a preferred embodiment of the present invention. Processor 100 is useful, for example, in Turbo decoding and Turbo-like decoding, as described in a concurrently-filed application entitled, "Efficient Parallel Iterative Decoding", which is assigned to the assignee of the present application and incorporated herein by reference. Processor 100 comprises a first decoder 102, similar to decoder 20, for decoding a first code, and a second decoder 106, also similar to decoder 20, for decoding a second code, both of which are applied to encode input data. Preferably, the first and second codes are different. A control unit 104 preferably controls the operation of the decoders. Preferably, an encoded packet is iteratively passed back and forth between decoders 102 and 106 until the packet is sufficiently decoded.

It is thus noted that decoders similar to decoder 20 may be used in a large variety of decoding processors of which processor 100 is only one preferred type of processor.

Figure 8:
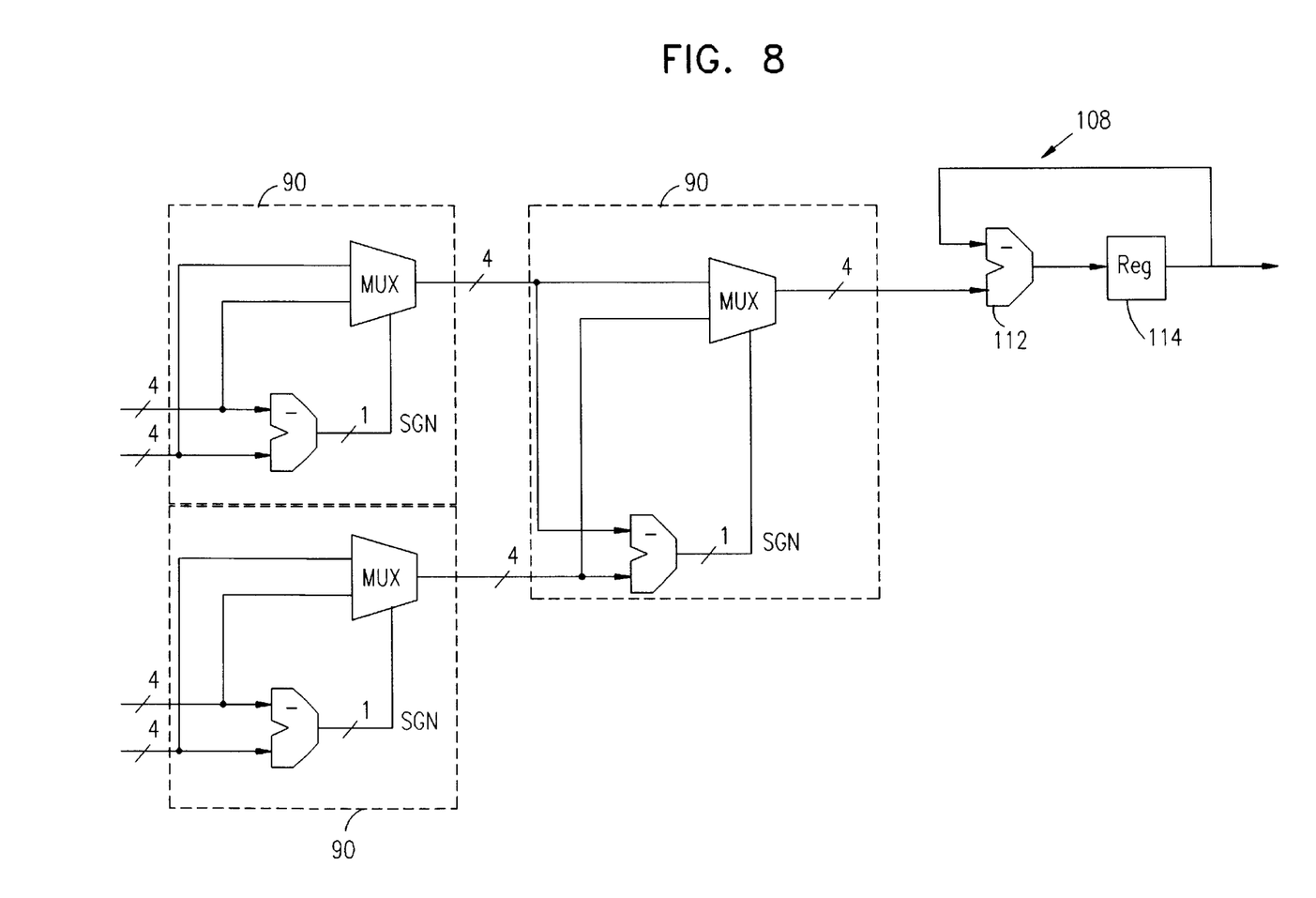
FIG. 8 is a block diagram of a minimum calculation unit, in accordance with another preferred embodiment of the present invention.

FIG. 8 is a block diagram of a minimum calculation unit 108, which may be used in place of unit 56, in accordance with another preferred embodiment of the present invention. A plurality of selecting units 90 determine the NM as described above with reference to unit 56 in FIG. 6. However, the time required for calculating the minimum may exceed the time of a clock cycle required for calculating the new state-metrics by combiners 50. Therefore, in order not to lengthen the clock cycle and slow down the operation of decoder 20, the minimum is calculated by unit 108 in a single clock cycle but is not used by combiners 50 in that same cycle. Rather, combiners 50 preferably use a NM calculated in a previous clock cycle.

Preferably, the calculated NM is stored in a register 114. In a subsequent cycle, the contents of register 114 are passed to combiners 50 for use in normalization. In the meanwhile, however, the minimum from the preceding clock cycle was subtracted from the state metrics in combiners 50. Therefore, register 114 preferably saves the minimum from the preceding clock cycle, which is then subtracted from the minimum from the current clock cycle by a subtractor 112. The difference in register 114 is passed to combiners 50. It is noted that other setups of one or more registers for storing the minimum may be used alternatively.

Although the above description involves an APP decoder of a specific code having only two code bits in each group, it will be appreciated by those skilled in the art that the principles of the present invention may be applied to a wide range of iterative decoders, including SOVA and MAP decoders, and to decoders having any number of code bits in each group.

It will be appreciated that the preferred embodiments described above are cited by way of example, and the full scope of the invention is limited only by the claims.

We claim:

1. A method of normalizing a plurality of state-metric registers in a decoder using a trellis, comprising:
   determining an approximate minimum of respective state-metric values stored in the plurality of state-metric registers; and
   subtracting the approximate minimum from the values.

2. A method according to claim 1, wherein the approximate minimum is always equal to or less than an actual minimum of the values in the plurality of state-metric registers.

3. A method according to claim 1, wherein determining the approximate minimum comprises determining the minimum of a predetermined number of most significant bits in the plurality of state-metric registers.

4. A method according to any of the preceding claims, wherein the predetermined number of most significant bits comprises between 30% and 60% of the number of bits in the register.

5. A method according to claim 1, and comprising calculating new state-metric values for the registers and wherein subtracting the approximate minimum is performed substantially concurrently with calculating the new values.

6. A method according to claim 1, and comprising storing in the state metric registers during a plurality of consecutive clock cycles a plurality of respective new values, wherein determining the approximate minimum comprises determining an approximate minimum of the new values in substantially every cycle.

7. A method according to claim 6, wherein determining the approximate minimum comprises determining an approximate minimum during a first one of the plurality of clock cycles, and wherein subtracting the approximate minimum comprises subtracting during a second one of the plurality of clock cycles after the first one.

8. A method according to claim 7, and comprising adjusting the approximate minimum responsive to a time gap between the first and second clock cycles.

9. A method according to claim 8, wherein adjusting the approximate minimum comprises subtracting from the approximate minimum calculated during the second cycle the approximate minimum calculated during the first cycle.

10. A state-metric calculation unit for use in a decoder which decodes using a trellis, comprising:
    a plurality of state-metric registers, which store respective state-metric values;
    a minimum calculation unit, which determines an approximate minimum of the plurality of registers; and
    a plurality of subtractors, which subtract the approximate minimum from the values in the plurality of registers.

11. The unit of claim 10, wherein the minimum calculation unit calculates the minimum of a predetermined number of most significant bits in the registers, and the subtractor subtracts the approximate minimum from the predetermined number of most significant bits of the registers.

12. The unit of claim 10 or claim 11, and comprising a plurality of recursive combiners which calculate for each register a next state-metric of the register and wherein each recursive combiner comprises a respective one of the subtractors.

13. The unit of claim 10, wherein the decoder comprises a Viterbi decoder.

14. The unit of claim 10, wherein the decoder comprises an APP decoder.

15. The unit of claim 10, wherein the decoder comprises a MAP decoder.

16. The unit of claim 10, wherein the decoder comprises a Trellis decoder.

17. The unit of claim 10, wherein the decoder comprises a Soft Output Viterbi decoder.

18. An iterative decoding processor for iterative decoding of a sequence of signal packets coded in accordance with a multi-component coding scheme, comprising a plurality of calculation units as described in claim 10.

* * * * *